(12) United States Patent
Zhang et al.

(10) Patent No.: US 12,085,794 B2
(45) Date of Patent: Sep. 10, 2024

(54) DISPLAY MODULE AND DISPLAY DEVICE

(71) Applicant: Wuhan China Star Optoelectronics Technology Co., Ltd., Hubei (CN)

(72) Inventors: Yi Zhang, Hubei (CN); Jingtao Wang, Hubei (CN); Xiao Yang, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/638,878

(22) PCT Filed: Feb. 10, 2022

(86) PCT No.: PCT/CN2022/075897
§ 371 (c)(1),
(2) Date: Feb. 28, 2022

(87) PCT Pub. No.: WO2023/142166
PCT Pub. Date: Aug. 3, 2023

(65) Prior Publication Data
US 2024/0036371 A1    Feb. 1, 2024

(30) Foreign Application Priority Data
Jan. 26, 2022  (CN) .......................... 202210095456.5

(51) Int. Cl.
*G02F 1/1333* (2006.01)
*G02F 1/13357* (2006.01)

(52) U.S. Cl.
CPC ...... *G02F 1/133314* (2021.01); *G02F 1/1336* (2013.01)

(58) Field of Classification Search
CPC .......................... G02F 1/133314; G02F 1/1336
See application file for complete search history.

(56) References Cited

U.S. PATENT DOCUMENTS

2021/0325731 A1   10/2021   Li et al.

FOREIGN PATENT DOCUMENTS

| | | |
|---|---|---|
| CN | 107454218 | 12/2017 |
| CN | 110133917 | 8/2019 |
| CN | 110911437 | 3/2020 |
| CN | 111326066 | 6/2020 |
| CN | 111445796 | 7/2020 |
| CN | 111474747 | 7/2020 |
| CN | 112485948 | 3/2021 |
| CN | 113539096 | 10/2021 |
| JP | 2000-353468 | 12/2000 |

(Continued)

OTHER PUBLICATIONS

English machine translation of CN 112485948A (Year: 2021).*

(Continued)

*Primary Examiner* — Anne M Hines

(57) ABSTRACT

A display module and a display device are disclosed. The display module includes a display panel and a back panel. The back panel includes a first sub-panel disposed on a backside of the display panel, and the first sub-panel includes a plurality of first regions spaced apart and a second region adjacent to the first regions, wherein a thickness of the first sub-panel in the first regions is greater than 0 and less than a thickness of the first sub-panel in the second region.

18 Claims, 4 Drawing Sheets

(56) References Cited

FOREIGN PATENT DOCUMENTS

WO     WO 2015/089929     6/2015

OTHER PUBLICATIONS

International Search Report and the Written Opinion Dated Oct. 25, 2022 From the International Searching Authority Re. Application No. PCT/CN2022/075897 and Its Translation Into English. (18 Pages).

Notification of Office Action and Search Report Dated Apr. 27, 2023 From The State Intellectual Property Office of the People's Republic of China Re. Application No. 202210095456.5 and Its Translation Into English. (14 Pages).

Notification of Office Action and Search Report Dated Nov. 7, 2023 From The State Intellectual Property Office of the People's Republic of China Re. Application No. 202210095456.5 and Its Translation Into English. (16 Pages).

\* cited by examiner

DISPLAY MODULE AND DISPLAY DEVICE

RELATED APPLICATIONS

This application is a National Phase of PCT Patent Application No. PCT/CN2022/075897 having International filing date of Feb. 10, 2022, which claims the benefit of priority of Chinese Patent Application No. 202210095456.5 filed on Jan. 26, 2022. The contents of the above applications are all incorporated by reference as if fully set forth herein in their entirety.

FIELD AND BACKGROUND OF THE INVENTION

The present disclosure relates to a field of display technologies, and more particularly to a display module and a display device having the display module.

In recent years, the exterior requirements of consumers for display devices such as cell phones, TVs, and notebooks are mainly large size, thin and light, and bezel-less, etc. To meet the requirements of consumers, many companies develop the design of display devices in the direction of thinness and lightness.

The existing display devices usually include a display panel and a back panel attached to the backside of the display panel to provide support and protection for the display panel. To meet the requirements of thinness and lightness of display devices, the structures and film layers are usually thinned or hollowed out in a display device, for example forming through holes in the back panel to reduce the weight of the back panel. However, after forming through holes, foreign objects can easily enter the display device through the through holes to affect the yield of the display device. If a protective film is attached to the back panel, it will increase the cost of labor and material resources.

SUMMARY OF THE INVENTION

Technical Problem

Embodiments of the present application provide a display module and a display device being able to reduce the weight of a back panel and prevent foreign objects from entering the display module through the back panel.

Technical Solutions

An embodiment of the present application provides a display module, comprising:
  a display panel;
  a back panel comprising a first sub-panel disposed on a backside of the display panel, and the first sub-panel comprising a plurality of first regions spaced apart and a second region adjacent to the first regions, wherein a thickness of the first sub-panel in the first regions is greater than 0 and less than a thickness of the first sub-panel in the second region.

In an embodiment of the present application, a plurality of recesses are defined in each of the first regions by the first sub-panel, so that the thickness of the first sub-panel in the first regions is less than the thickness of the first sub-panel in the second region.

In an embodiment of the present application, the first sub-panel comprises a first lateral surface away from one side of the display panel, and a plurality of first sub-recesses located in each of the first regions are defined at the first lateral surface by the recesses.

In an embodiment of the present application, the first sub-panel further comprises a second lateral surface disposed corresponding to the first lateral surface, and a plurality of second sub-recesses located in each of the first regions are defined at the second lateral surface by the recesses.

In an embodiment of the present application, at least one of the first sub-recesses and at least one of the second sub-recesses are disposed in one of the first regions, and the first sub-recess and the second sub-recess are at least partially overlapped.

In an embodiment of the present application, one of the first sub-recesses or one of the second sub-recesses is disposed in one of the first regions, wherein at least one of the second sub-recesses is disposed between any two of the first sub-recesses adjacent to each other, or at least one of the first sub-recesses is disposed between any two of the second sub-recesses adjacent to each other.

In an embodiment of the present application, a shape of the recesses comprises a hexagonal shape, and each edge of one of the recesses is disposed opposite to an edge of another one of the recesses adjacent thereto.

In an embodiment of the present application, the first sub-panel comprises a support portion disposed in the second region, the support portion is disposed around each of the recesses, and a depth of the recesses is less than a thickness of the support portion.

In an embodiment of the present application, the support portion comprises a first support portion disposed along a boundary of the first sub-panel and a second support portion disposed between the recesses adjacent to each other, wherein the second support portion is continuously disposed between the recesses adjacent to each other, the first support portion is connected with the second support portion, so that the support portion is distributed in a mesh shape within the second region.

In an embodiment of the present application, the display module further comprises a backlight module disposed between the first sub-panel and the display panel, the back panel further comprises a second sub-panel, and an end of the second sub-panel is connected to an end portion of the first sub-panel, another end of the second sub-panel is extending along a direction of the first sub-panel close to the display panel, so that the display panel and the backlight module are located within a region surrounded by the first sub-panel and the second sub-panel;
  wherein a thickness of the second sub-panel is greater than the thickness of the first sub-panel in the first regions.

In an embodiment of the present application, the thickness of the first sub-panel in the first regions is greater than or equal to 0.1 mm.

According to the above-mentioned purpose of the present application, a display device is provided. The display device comprises a display module. The display module comprises:
  a display panel;
  a back panel comprising a first sub-panel disposed on a backside of the display panel, and the first sub-panel comprising a plurality of first regions spaced apart and a second region adjacent to the first regions, wherein a thickness of the first sub-panel in the first regions is greater than 0 and less than a thickness of the first sub-panel in the second region.

In an embodiment of the present application, a plurality of recesses are defined in each of the first regions by the first sub-panel, so that the thickness of the first sub-panel in the first regions is less than the thickness of the first sub-panel in the second region.

In an embodiment of the present application, the first sub-panel comprises a first lateral surface away from one side of the display panel, and a plurality of first sub-recesses located in each of the first regions are defined at the first lateral surface by the recesses.

In an embodiment of the present application, the first sub-panel further comprises a second lateral surface disposed corresponding to the first lateral surface, and a plurality of second sub-recesses located in each of the first regions are defined at the second lateral surface by the recesses.

In an embodiment of the present application, at least one of the first sub-recesses and at least one of the second sub-recesses are disposed in one of the first regions, and the first sub-recess and the second sub-recess are at least partially overlapped.

In an embodiment of the present application, one of the first sub-recesses or one of the second sub-recesses is disposed in one of the first regions, wherein at least one of the second sub-recesses is disposed between any two of the first sub-recesses adjacent to each other, or at least one of the first sub-recesses is disposed between any two of the second sub-recesses adjacent to each other.

In an embodiment of the present application, a shape of the recesses comprises a hexagonal shape, and each edge of one of the recesses is disposed opposite to an edge of another one of the recesses adjacent thereto.

In an embodiment of the present application, the first sub-panel comprises a support portion disposed in the second region, the support portion is disposed around each of the recesses, and a depth of the recesses is less than a thickness of the support portion.

In an embodiment of the present application, the support portion comprises a first support portion disposed along a boundary of the first sub-panel and a second support portion disposed between the recesses adjacent to each other, wherein the second support portion is continuously disposed between the recesses adjacent to each other, the first support portion is connected with the second support portion, so that the support portion is distributed in a mesh shape within the second region.

Beneficial Effects

Compared with the prior art, by reducing the thickness of the first sub-panel in the first region, which is greater than 0, the present application can simultaneously reduce the weight of the back panel and prevent foreign objects from entering the display module through the first sub-panel, thereby improving the yield of the display module while implementing the thinness and the lightness of the display module. In addition, compared with the formation of through holes in the relevant technology, the reduction of thickness of the first sub-panel in the present application can retain part of the thickness in the first region of the first sub-panel, and further increase the strength of support and protection of the back panel, thereby increasing the yield of the display module.

BRIEF DESCRIPTION OF THE SEVERAL VIEWS OF THE DRAWINGS

The specific embodiments of the present application will be described in detail with the accompanying drawings, which makes the technical solutions and other beneficial effects of the present application obvious.

DESCRIPTION OF SPECIFIC EMBODIMENTS OF THE INVENTION

Figure 1:
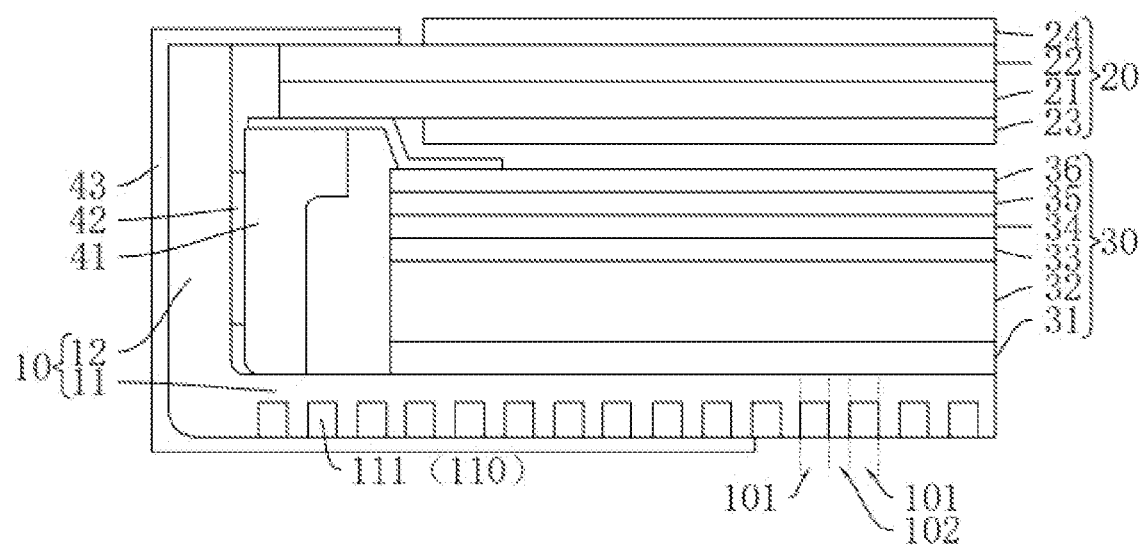
FIG. 1 is a schematic diagram of a structure of a display module provided in an embodiment of the present application.

The technical solutions in the embodiments of the present application will be clearly and completely described below with the accompanying drawings in the embodiments of the present application. Obviously, the described embodiments are merely part of embodiments of the present application, but not all embodiments. Based on the embodiments of the present application, all other embodiments obtained by a person skilled in the art without creative labor, should be considered within the scope of protection of the present application.

The following disclosure provides different implementations or examples used to implement the different structures of the present application. To simplify the disclosure of the present application, the components and settings of particular examples are described below. Certainly, they are examples only and are not intended to limit the present application. Furthermore, the present application may repeat reference numbers and/or reference letters in different examples, such repetition being for the purpose of simplicity and clarity and not in itself indicative of a relationship between the various embodiments and/or settings discussed. In addition, the present application provides various examples of specific processes and materials, but a person having ordinary skill in the art may be aware of other applications of processes and/or the use of other materials.

An embodiment of the present application provides a display module. The display module includes a back panel 10 and a display panel 20. The back panel 10 includes a first sub-panel 11 disposed on a backside of the display panel 20, and the first sub-panel 11 includes a plurality of first regions 101 spaced apart and a second region 102 adjacent to the first regions 101.

Furthermore, a thickness of the first sub-panel 11 in the first regions 101 is greater than 0 and less than a thickness of the first sub-panel 11 in the second region 102.

During implementing the application, for reducing the weight of the display module in relevant technologies, through holes are often formed in the back panel to reduce the weight of the back panel so as to achieve the purpose of reducing the weight of the display module. However, due to the disposition of through holes on the back panel, it is easy for foreign objects to enter the display module through the through holes on the back panel, which in turn affects the yield of the display module; if a protective film is attached to the back panel to prevent foreign objects from entering the display module through the through holes, it will increase the cost of labor and material resources. In embodiments of the present application, the thickness of the first region 101 of the first sub-panel 11 is reduced to be greater than 0, so that the foreign objects can be prevented from entering the display module through the first sub-panel 11 while reducing the weight of the back panel, thereby improving the yield of the display module while achieving thinness and lightness of the display module. In addition, compared with the formation of through holes in the relevant technologies, the thinning of the first sub-panel of the present application can retain a part of thickness of the first sub-panel 11 in the first region 101, so the strength of support and protection of the back panel 10 can be enhanced, thereby increasing the yield of the display module.

Specifically, please proceed to the reference of FIG. 1. In an embodiment of the present application, a display module includes a back panel 10, a display panel 20, and a backlight module 30.

Specifically, the display panel 20 may be a liquid crystal display panel, and the display panel 20 includes an array substrate 21, a color film substrate 22, a lower polarizer 23, and an upper polarizer 24. The array substrate 21 is disposed corresponding to the color film substrate 22. The lower polarizer 23 is disposed on one side of the array substrate 21 away from the color film substrate 22. The upper polarizer 24 is disposed on one side of the color film substrate 22 away from the array substrate 21. It should be noted that only the array substrate 21 and the color film substrate 22 are respectively described above, these structure layers are simply described with part of the structure and components of the display panel, but not limited herein. For example, the color film substrate 22 includes black matrices (BM), RGB color resist layers, etc., the array substrate 21 includes TFT switches, scan lines, data lines, pixel electrodes, common electrodes, etc. The display panel 20 further includes various other display components, e.g., alignment films, liquid crystal layers, frame glue, etc., between the array substrate 21 and the color film substrate 22. These details can be implemented with reference to the existing technologies, so they are not redundantly described herein.

The backlight module 30 is disposed on a backside of the display panel 20, namely one side of the lower polarizer 23 away from the array substrate 21. The backlight module 30 includes an optical sheet set disposed on one side of the lower polarizer 23 away from the array substrate 21 and a light source. Specifically, the optical sheet set includes an upper diffusion sheet 36, an upper prism sheet 35, a lower prism sheet 34, a lower diffusion sheet 33, a light guide plate 32, and a reflect sheet 31 sequentially disposed on one side of the lower polarizer 23 away from the array substrate 21. On the other hand, when the backlight module 30 is an edge type, the light source is disposed on a lateral surface of the light guide plate 32. When the backlight module 30 is a direct type, the light source is disposed below the light guide plate 32, namely disposed on one side of the light guide plate 32 away from the display panel 20.

The back panel 10 includes a first sub-panel 11 disposed on a backside of the display panel 20, namely one side of the backlight module 30 away from the display panel 20. In addition, the back panel 10 further includes a second sub-panel 12. An end of the second sub-panel 12 is connected to an end portion of the first sub-panel 11, another end of the second sub-panel 12 is extending along a direction of the first sub-panel 11 close to the backlight module 30 and the display panel 20, so that the backlight module 30 and the display panel 20 are located within a region surrounded by the first sub-panel 11 and the second sub-panel 12.

Moreover, in an embodiment of the present application, the display module further includes a support member 41. The support member 41 is attached to one side of the second sub-panel 12 close to the backlight module 30 through a glue layer 42. An end of the support member 41 abuts against the first sub-panel 11, another end of the support member 41 supports the display panel 20. The backlight module 30 may be directly disposed on the first sub-panel 11. The display panel 20 is placed on the support member 41 to be spaced apart from the backlight module 30. The display module further includes a fixing member 43 disposed on a lateral surface of the display module. An end of the fixing member 43 extends to one side of the first sub-panel 11 away from the backlight module 30, another end of the fixing member 43 extends to one side of the display panel 20 away from the backlight module so that the functions of supporting and fixing the back panel 10, the display panel 20, and the backlight module 30 are achieved, thereby enhancing the stability of the display module.

In an embodiment of the present application, the first sub-panel 11 includes a plurality of first regions 101 spaced apart and a second region 102 adjacent to the first regions 101. A thickness of the first sub-panel 11 in the first regions 101 is greater than 0 and less than a thickness of the first sub-panel 11 in the second region 102. That is, the embodiment of the present application reduces the thickness of the part of the first sub-panel 11 within the first regions 101 to define recesses 110 for reducing the weight of the back panel 10. Meanwhile, it also prevents the foreign objects from entering the display module through the back panel 10, thus increasing the yield of the display module.

It can be understood that in the relevant technologies, a liquid crystal display module includes components such as a display panel, a backlight module, and a back panel, and each component is disposed separately with a complex structure and more parts, and its weight is also larger, and thus it is especially important for the liquid crystal display module to achieve its weight reduction. In the embodiment of the present application, the back panel 10 is partially thinned 10 to achieve the weight reduction thereof and facilitate the lightweight design of a liquid crystal display module.

It should be noted that the thickness of the first sub-panel 11 in the first regions 101 is greater than or equal to 0.1 mm, so that the strength of support and protection of the back panel 10 can be guaranteed based on implementing the weight reduction of the back panel 10. The first regions 101 may be any region on the first sub-panel 11 or may be a particular region of the first sub-panel 11. It is not limited herein. It can be selected according to the practical demands.

Optionally, a shape of the recess 110 may be a triangular shape, a circular shape, a rhombic shape, a polygonal shape, or other shapes with different profiles.

Figure 2:
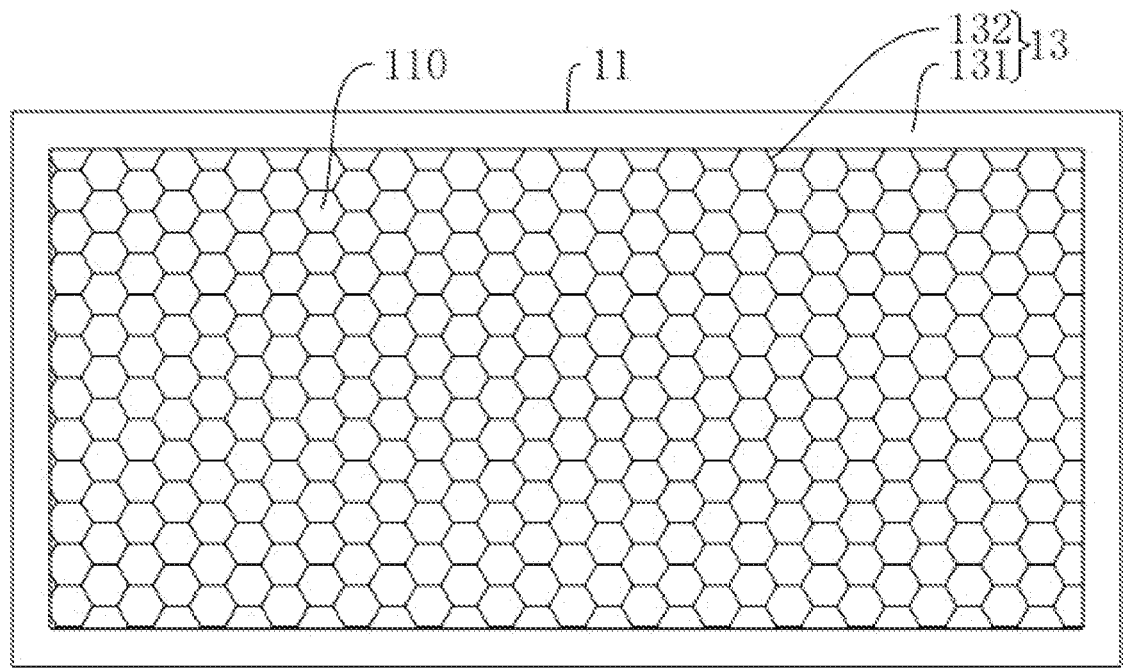
FIG. 2 is a schematic diagram of the planar distribution of recesses on a first sub-panel provided in an embodiment of the present application.
Figure 3:
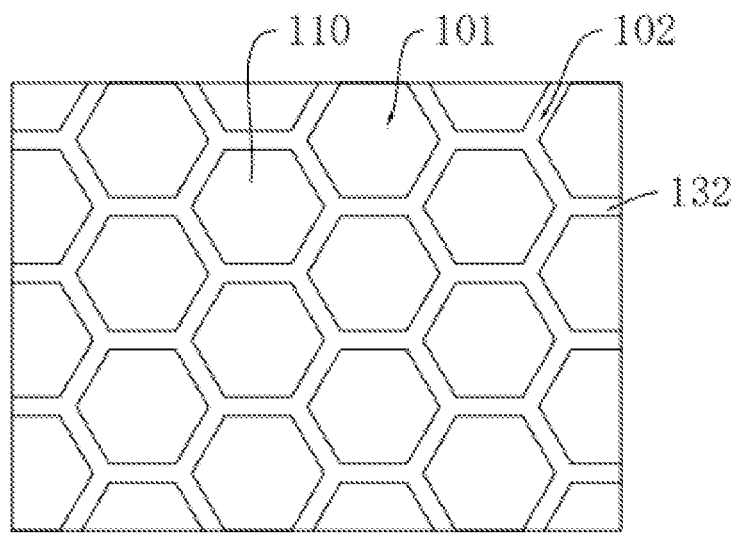
FIG. 3 is a schematic diagram of a partial enlargement of the planar distribution of recesses on a first sub-panel provided in an embodiment of the present application.

Preferably, the shape of the recess is a hexagon. Please refer to FIG. 1, FIG. 2, and FIG. 3. FIG. 2 and FIG. 3 are the schematic diagrams of the arrangement and distribution of the recesses 110 of an embodiment of the present application. Each of the recesses 110 is a hexagon located within the corresponding one of the first regions 101. Each edge of one of the recesses 110 is disposed opposite to an edge of another one of the recesses 110 adjacent thereto, so that a plurality of hexagonal recesses 110 are arranged in a honeycomb pattern. In the manner of this arrangement, the material of the back panel 10 can be maximally removed, namely the thinning of the back panel 10 can be maximized.

In an embodiment of the present application, the first sub-panel 11 includes a support portion 13 disposed in the second region 102. The support portion 13 disposed around each of the recesses 110, and a depth of the recesses 110 is less than a thickness of the support portion 13. The embodiment of the present application sets the support portion 13 at where the recesses 110 are thinned in the first sub-panel 11 with a larger thickness for surrounding, so that the strength of support and protection of the first sub-panel 11 can be effectively enhanced based on reducing the weight of the back panel.

Furthermore, the support portion 13 includes a first support portion 131 disposed along a boundary of the first sub-panel 11 and a second support portion 132 disposed between the recesses 110 adjacent to each other. The second support portion 132 is continuously disposed between the recesses 110 adjacent to each other, the first support portion 131 is connected with the second support portion 132, so that the support portion 13 is distributed in a mesh shape within the second region 102 as shown in FIG. 2 and FIG. 3, the force forced on the support portion 13 can be therefore dispersed to the first support portion 131 and the second support portion 132 which are in a mesh connection, and the strength of support and protection of the first sub-panel 11 can be further improved.

In an embodiment of the present application, please refer to FIG. 1, the recesses 110 include first sub-recesses 111 disposed on one side of the first sub-panel 11 away from the backlight module 30. The shape and arrangement of the first sub-recesses 111 can be the same as the shape and arrangement of the recesses 110 mentioned above. For example, the plurality of first sub-recesses 111 are all hexagons arranged on one side of the first sub-panel 11 away from the display panel 20 in a honeycomb pattern.

Figure 4:
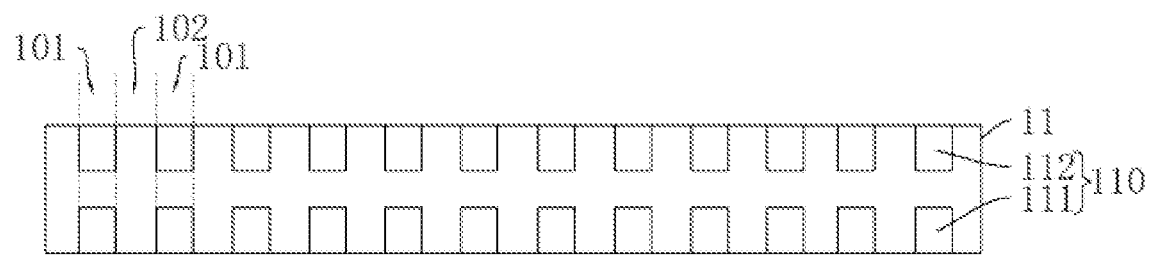
FIG. 4 is a schematic diagram of the structure of recesses in a first sub-panel provided in an embodiment of the present application.

Furthermore, please refer to FIG. 1 and FIG. 4. The recesses 110 may further include first sub-recesses 111 disposed on one side of the first sub-panel 11 away from the backlight module 30 and second sub-recesses 112 disposed on one side of the first sub-panel 11 close to the backlight module 30. It can be understood that FIG. 1 is only used to illustrate the position relationship between the structures of the display module. The positions and the structures of the first sub-recesses 111 and the second sub-recesses 112 can be referred to FIG. 4. The shape and arrangement of the second sub-recesses 112 can also be the same as the shape and arrangement of the recesses 110 mentioned above. For example, the plurality of second sub-recesses 112 are all hexagons arranged on one side of the first sub-panel 11 close to the display panel 20 in a honeycomb pattern.

One of the first sub-recesses 111 located on one side of the first sub-panel 11 away from the backlight module 30 and one of the second sub-recesses 112 located on one side of the first sub-panel 11 close to the backlight module 30 are defined in each of the first regions 101. In each of the first regions 101, the first sub-recess 111 and the second sub-recess 112 are aligned with each other. In addition, in each of the first regions 101, the thickness of the first sub-panel 11 further needs to be greater than or equal to 0.1 mm.

Figure 5:
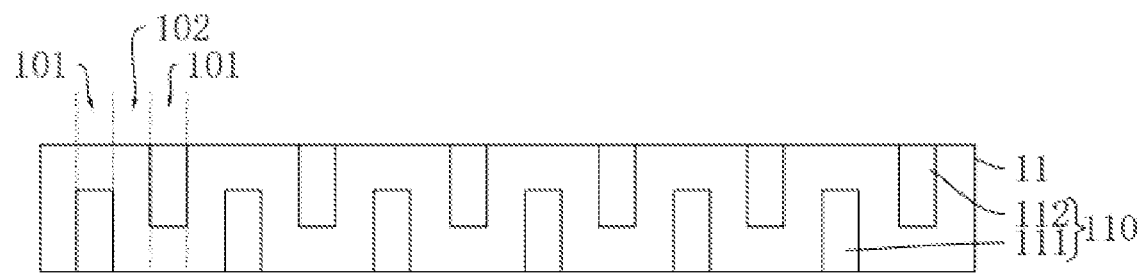
FIG. 5 is a schematic diagram of the structure of recesses in another first sub-panel provided in an embodiment of the present application.

Additionally, please refer to FIG. 5, one of the first sub-recesses 111 located on one side of the first sub-panel 11 away from the backlight module 30 or one of the second sub-recesses 112 located on one side of the first sub-panel 11 close to the backlight module 30 is defined in each of the first regions 101, and one of the second sub-recesses 112 is distributed between two of the first sub-recesses 111 adjacent to each other. In addition, in each of the first regions 101, the thickness of the first sub-panel 11 further needs to be greater than or equal to 0.1 mm.

Figure 6:
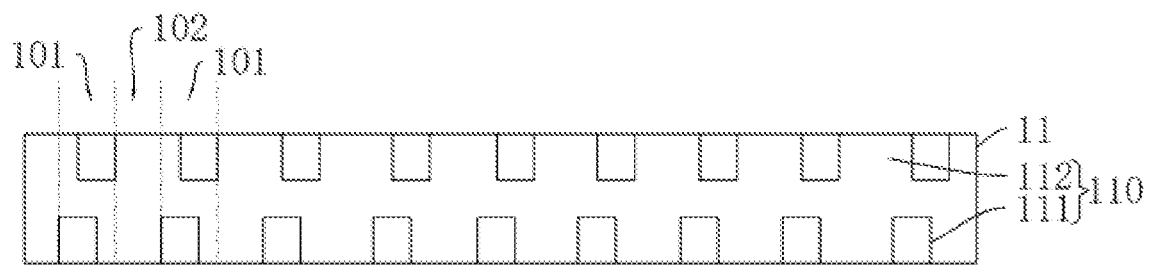
FIG. 6 is a schematic diagram of the structure of recesses in another first sub-panel provided in an embodiment of the present application.

Additionally, please refer to FIG. 6, one of the first sub-recesses 111 located on one side of the first sub-panel 11 away from the backlight module 30 and one of the second sub-recesses 112 located on one side of the first sub-panel 11 close to the backlight module 30 are defined in each of the first regions 101. In each of the first regions 101, the first sub-recess 111 and the second sub-recess 112 are partially overlapped with each other. In addition, in each of the first regions 101, the thickness of the first sub-panel 11 further needs to be greater than or equal to 0.1 mm.

Figure 7:
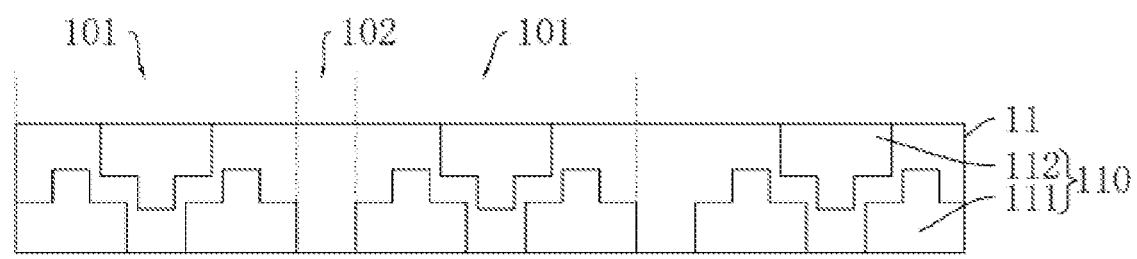
FIG. 7 is a schematic diagram of the structure of recesses in another first sub-panel provided in an embodiment of the present application.

Additionally, please refer to FIG. 7, two of the first sub-recesses 111 located on one side of the first sub-panel 11 away from the backlight module 30 and one of the second sub-recesses 112 located on one side of the first sub-panel 11 close to the backlight module 30 are defined in each of the first regions 101. In each of the first regions 101, the first sub-recesses 111 and the second sub-recess 112 are partially overlapped. The first sub-recesses 111 and the second sub-recess 112 are recesses with different shapes. That is, recess depths of the first sub-recesses 111 and the second sub-recess 112 at different positions may not be the same. In addition, in each of the first regions 101, the thickness of the first sub-panel 11 further needs to be greater than or equal to 0.1 mm.

It should be noted that besides the arrangement of the first sub-recess 111 and the second sub-recess 112 mentioned above, as long as a condition that the recess 110 is defined in the first region 101 is satisfied, the recess 101 is not limited to the first sub-recess 111 defined alone on one side of the first sub-panel 11 away from the backlight module 30, the second sub-recess 112 defined alone on one side of the first sub-panel 11 close to the backlight module 30, or both the first sub-recess 111 defined on one side of the first sub-panel 11 away from the backlight module 30 and the second sub-recess 112 defined on one side of the first sub-panel 11 close to the backlight module 30. In addition, the first sub-recess 111 and the second sub-recess 112 may be located in the same first sub-region 101 or located in different first sub-regions 101. The first sub-recess 111 and the second sub-recess 112 located in the same first region 101 may be spaced apart from each other, partially overlapped with each other, or aligned with each other. Furthermore, at least one of the second sub-recesses 112 may be disposed between two of the first sub-recesses 111 adjacent to each other, or at least one of the first sub-recesses 111 may be disposed between two of the second sub-recesses 112 adjacent to each other.

In an embodiment of the present application, since a plurality of second sub-recesses 112 may be disposed on one side of the first sub-panel 11 close to the backlight module 30, the light source in the backlight module 30 is disposed in the second sub-recesses 112 to achieve the function of fixing the light source for enhancing the stability of the backlight module 30, thereby fixing the light source while implementing the weight reduction of the display module without adding additional process.

When the backlight module 30 is an edge type, the light source may be disposed in the second sub-recess 112 of a lateral surface of the light guide plate 32 and may protrude from a surface of one side of the first sub-panel 11 close to the backlight module 30, so that light emitted by the light source enters the light guide plate 32.

When the backlight module 30 is a direct type, the light source may be disposed in the plurality of second sub-recesses 112 between the light guide plate 32 and the first sub-panel 11, so that light emitted by the light source may enter the light guide plate 32 above the light source.

On the other hand, the second sub-panel 12 is located at a lateral surface of the display panel 20 and the backlight module 30. In an embodiment of the present application, a thickness of the second sub-panel 12 is greater than the thickness of the first sub-panel 11 in the first regions 101. The thickness of the second sub-panel 12 can be equal to the thickness of the first sub-panel 11 in the second region 102, namely the second sub-panel 12 is not thinned. In another embodiment of the present application, the second sub-panel 12 may also be thinned, namely recesses 110 are defined on one side of the second sub-panel 12 close to the display panel 20 and the backlight module 30 and/or one side of the second sub-panel 12 away from the display panel 20 and the backlight module 30, such that the foreign objects can be prevented from entering the display module through the second sub-panel 12 while reducing the weight of the second sub-panel 12, thereby reducing the weight of the display module and increasing the yield of the display module.

Figure 8:
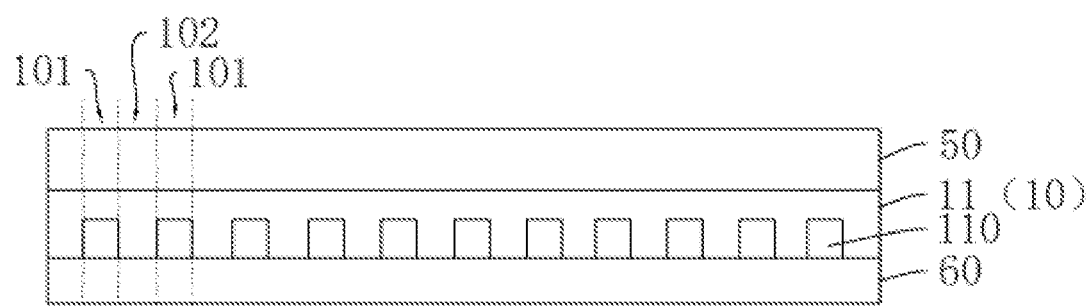
FIG. 8 is a schematic diagram of another structure of a display module provided in an embodiment of the present application.

Additionally, in another embodiment of the present application, please refer to FIG. 8. The difference between this embodiment and the previous one of the embodiments is that the display module includes an OLED display panel 50.

In an embodiment of the present application, the display module includes the OLED display panel 50, the back panel 10, and a composite heat-dissipation layer 60. The back panel includes a first sub-panel 11 disposed on a backside of the OLED display panel 50. The composite heat-dissipation layer 60 is disposed on one side of the first sub-panel 11 away from the OLED display panel 50.

In this embodiment, the first sub-panel 11 includes a plurality of first regions 101 spaced apart and a second region 102 disposed adjacent to the first regions 101. A thickness of the first sub-panel 11 in the first regions 101 is greater than a thickness of the first sub-panel 11 in the second region 102.

Furthermore, recesses 110 located within the first regions 101 are defined by the first sub-panel 11, so the weight of the first sub-panel 11 can be reduced, and the foreign objects can be prevented from entering the display module through the first sub-panel 11.

Similarly, in this embodiment, the recesses 110 may also include first sub-recesses defined on one side of the first sub-panel 11 close to the composite heat-dissipation layer 60 and/or second sub-recesses defined on one side of the first sub-panel 11 close to the OLED display panel 50. The thickness of the first sub-panel 11 in the first region 101 needs to be greater than or equal to 0.1 mm.

It should be noted that in this embodiment, the disposition of the recesses 110 in the first sub-panel 11 may be the same as the previous one of the embodiments. It is not redundantly described herein.

Additionally, the embodiments of the present application were tested using the solutions of the weight reduction of the back panel described in the above-mentioned embodiments, in which GM55 material (high-strength aluminum) was used to prepare a back panel with a size of 14.2 inches and a thickness of 0.25 T.

Specifically, on the premise of ensuring a certain strength of the back panel, a recess is formed on the back panel and the thickness in the recess is reduced by 0.1 T to obtain Embodiment I; a recess is formed on the back panel and the thickness in the recess is reduced by 0.15 T to obtain Embodiment II; furthermore, a through hole is formed on the back panel to obtain Compared Example I, and the initial volume and initial weight of the back panel, and data of the volume and the weight of each Embodiment and Compared Example after the weight reduction are shown in Table I below.

TABLE I

| Solution of back panel | Volume of back panel (mm$^3$) | Weight of back panel (g) | Weight reduction ratio relative to full back panel |
|---|---|---|---|
| Back panel | 16482.9 | 43.5 | / |
| Compared Example I | 14126.7 | 37.3 | 16% |
| Embodiment I | 12241 | 32.2 | 35% |
| Embodiment II | 10120 | 26.6 | 63% |

As can be seen from Table I above, Embodiment I and Embodiment II can respectively reduce the weight of the back panel by 35% and 63% while ensuring the strength of the back panel. However, the weight reduction ration of Compared Example I is merely 16%. The effects of weight reduction of Embodiment I and Embodiment II are better than the effect of weight reduction of Compared Example I, and no through hole is formed on the back panels of Embodiment I and Embodiment II, so that the foreign objects can be effectively prevented from entering the display module through the back panel, thereby increasing the yield of the display module.

From the above discussion, for reducing the weight of the display module in relevant technologies, through holes are often formed in the back panel to reduce the weight of the back panel so as to achieve the purpose of reducing the weight of the display module. However, due to the disposition of through holes on the back panel, it is easy for foreign objects to enter the display module through the through holes on the back panel, which in turn affects the yield of the display module; if a protective film is attached to the back panel to prevent foreign objects from entering the display module through the through holes, it will increase the cost of labor and material resources. In embodiments of the present application, the thickness of the first region 101 of the first sub-panel 11 is reduced to be greater than 0, so that the foreign objects can be prevented from entering the display module through the first sub-panel 11 while reducing the weight of the back panel, thereby improving the yield of the display module while achieving thinness and lightness of the display module. In addition, compared with the formation of through holes in the relevant technologies, the thinning of the first sub-panel of the present application can retain a part of thickness of the first sub-panel 11 in the first region 101, so the strength of support and protection of the back panel 10 can be enhanced, thereby increasing the yield of the display module.

Additionally, embodiments of the present application also provide a display device. The display device includes the display module of the embodiments mentioned above.

Moreover, the display device may include a display screen for cell phones, tablets, laptops, vehicles, and industrial control applications, etc.

In the embodiments described above, the description of each embodiment has its own focus, and the parts that are not described in detail in a certain embodiment can be found in the relevant descriptions of other embodiments.

A display module and a display device provided by the embodiments of the present application have been described in detail above, and the principles and implementations of the present application are described with specific examples. The descriptions of the above embodiments are only used to help understand the technology solutions and core ideas of the present application; a person of ordinary skill in the art should understand that: it is still possible to modify the technical solutions described in each of the above-mentioned embodiments, or to perform equivalent replacements for some of the technical features; and these modifications or replacements do not make the essence of the corresponding technical solutions deviates from the scope of the technical solutions of each embodiment of the present application.

What is claimed is:

1. A display module, comprising:
   a display panel;
   a backlight module disposed on a backside of the display panel;
   a back panel comprising a first sub-panel disposed on a side of the backlight module away from the display panel, and the first sub-panel comprising a plurality of first regions spaced apart and a second region adjacent to the first regions, wherein a thickness of the first sub-panel in the first regions is greater than 0 and less than a thickness of the first sub-panel in the second region;
   wherein a plurality of recesses are defined in each of the first regions by the first sub-panel, the plurality of recesses include a plurality of second sub-recesses disposed on a side of the first sub-panel close to the backlight module, a light source in the backlight module is disposed in the second sub-recesses.

2. The display module as claimed in claim 1, wherein the first sub-panel comprises a first lateral surface away from one side of the display panel, and a plurality of first sub-recesses located in each of the first regions are defined at the first lateral surface by the recesses.

3. The display module as claimed in claim 2, wherein the first sub-panel further comprises a second lateral surface disposed corresponding to the first lateral surface, and the plurality of second sub-recesses located in each of the first regions are defined at the second lateral surface by the recesses.

4. The display module as claimed in claim 3, wherein at least one of the first sub-recesses and at least one of the second sub-recesses are disposed in one of the first regions, and the first sub-recess and the second sub-recess are at least partially overlapped.

5. The display module as claimed in claim 3, wherein one of the first sub-recesses or one of the second sub-recesses is disposed in one of the first regions, wherein at least one of the second sub-recesses is disposed between any two of the first sub-recesses adjacent to each other, or at least one of the first sub-recesses is disposed between any two of the second sub-recesses adjacent to each other.

6. The display module as claimed in claim 1, wherein a shape of the recesses comprises a hexagonal shape, and each edge of one of the recesses is disposed opposite to an edge of another one of the recesses adjacent thereto.

7. The display module as claimed in claim 1, wherein the first sub-panel comprises a support portion disposed in the second region, the support portion is disposed around each of the recesses, and a depth of the recesses is less than a thickness of the support portion.

8. The display module as claimed in claim 7, wherein the support portion comprises a first support portion disposed along a boundary of the first sub-panel and a second support portion disposed between the recesses adjacent to each other, wherein the second support portion is continuously disposed between the recesses adjacent to each other, the first support portion is connected with the second support portion, so that the support portion is distributed in a mesh shape within the second region.

9. The display module as claimed in claim 1, wherein the display module further comprises a backlight module disposed between the first sub-panel and the display panel, the back panel further comprises a second sub-panel, and an end of the second sub-panel is connected to an end portion of the first sub-panel, another end of the second sub-panel is extending along a direction of the first sub-panel close to the display panel, so that the display panel and the backlight module are located within a region surrounded by the first sub-panel and the second sub-panel;
   wherein a thickness of the second sub-panel is greater than the thickness of the first sub-panel in the first regions.

10. The display module as claimed in claim 1, wherein the thickness of the first sub-panel in the first regions is greater than or equal to 0.1 mm.

11. A display device comprising a display module, the display module comprising:
    a display panel;
    a backlight module disposed on a backside of the display panel;
    a back panel comprising a first sub-panel disposed on a side of the backlight module away from the display panel, and the first sub-panel comprising a plurality of first regions spaced apart and a second region adjacent to the first regions, wherein a thickness of the first sub-panel in the first regions is greater than 0 and less than a thickness of the first sub-panel in the second region;
    wherein a plurality of recesses are defined in each of the first regions by the first sub-panel, the plurality of recesses include a plurality of second sub-recesses disposed on a side of the first sub-panel close to the backlight module, a light source in the backlight module is disposed in the second sub-recesses.

12. The display device as claimed in claim 11, wherein the first sub-panel comprises a first lateral surface away from one side of the display panel, and a plurality of first sub-recesses located in each of the first regions are defined at the first lateral surface by the recesses.

13. The display device as claimed in claim 12, wherein the first sub-panel further comprises a second lateral surface disposed corresponding to the first lateral surface, and the plurality of second sub-recesses located in each of the first regions are defined at the second lateral surface by the recesses.

14. The display device as claimed in claim 13, wherein at least one of the first sub-recesses and at least one of the second sub-recesses are disposed in one of the first regions, and the first sub-recess and the second sub-recess are at least partially overlapped.

15. The display device as claimed in claim 13, wherein one of the first sub-recesses or one of the second sub-recesses is disposed in one of the first regions, wherein at least one of the second sub-recesses is disposed between any two of the first sub-recesses adjacent to each other, or at least one of the first sub-recesses is disposed between any two of the second sub-recesses adjacent to each other.

16. The display device as claimed in claim 11, wherein a shape of the recesses comprises a hexagonal shape, and each edge of one of the recesses is disposed opposite to an edge of another one of the recesses adjacent thereto.

17. The display device as claimed in claim 11, wherein the first sub-panel comprises a support portion disposed in the second region, the support portion is disposed around each of the recesses, and a depth of the recesses is less than a thickness of the support portion.

18. The display device as claimed in claim 17, wherein the support portion comprises a first support portion disposed along a boundary of the first sub-panel and a second support portion disposed between the recesses adjacent to each other, wherein the second support portion is continuously disposed between the recesses adjacent to each other, the first support portion is connected with the second support portion, so that the support portion is distributed in a mesh shape within the second region.

* * * * *